(12) United States Patent
Yin et al.

(10) Patent No.: US 9,099,417 B2
(45) Date of Patent: Aug. 4, 2015

(54) PIXEL CIRCUIT, DRIVING METHOD THEREOF AND DISPLAY DEVICE

(71) Applicant: BOE TECHNOLOGY GROUP CO., LTD., Beijing (CN)

(72) Inventors: Jingwen Yin, Beijing (CN); Zhongyuan Wu, Beijing (CN); Liye Duan, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 24 days.

(21) Appl. No.: 14/236,283

(22) PCT Filed: Aug. 12, 2013

(86) PCT No.: PCT/CN2013/081292
§ 371 (c)(1),
(2) Date: Jan. 30, 2014

(87) PCT Pub. No.: WO2014/198083
PCT Pub. Date: Dec. 18, 2014

(65) Prior Publication Data
US 2015/0028765 A1    Jan. 29, 2015

(51) Int. Cl.
*H01L 27/32* (2006.01)
*G09G 3/32* (2006.01)

(52) U.S. Cl.
CPC ............ *H01L 27/3265* (2013.01); *G09G 3/325* (2013.01); *G09G 2310/0251* (2013.01); *G09G 2310/0262* (2013.01); *G09G 2310/067* (2013.01); *G09G 2320/045* (2013.01)

(58) Field of Classification Search
CPC ... G09G 3/3233; G09G 3/3241; G09G 3/325; G09G 3/3258; G09G 2320/045; G09G 2310/0251; G09G 2300/0809; G09G 2300/0814; G09G 2300/0819; G09G 2300/0876; G09G 2310/0262; G09G 2310/067; H01L 27/3265
USPC .............................. 345/76, 82, 205, 212, 214
See application file for complete search history.

(56) References Cited

U.S. PATENT DOCUMENTS 7,876,296 B2 *   1/2011   Jang et al. ..................... 345/82
2004/0174354 A1 *   9/2004   Ono et al. ..................... 345/204
(Continued)

FOREIGN PATENT DOCUMENTS

| CN | 101996579 A | 3/2011 |
|---|---|---|
| CN | 102982767 A | 3/2013 |

(Continued)

OTHER PUBLICATIONS

Chinese Office Action regarding Application No. 2013102313858 dated Nov. 2, 2014. Translation provided by Dragon Intellectual Property Law Firm.

*Primary Examiner* — Tom Sheng
(74) *Attorney, Agent, or Firm* — Harness, Dickey & Pierce, P.L.C.

(57) ABSTRACT

The present invention relates to the field of display technology, and provides a pixel circuit, a driving method thereof, and a display device, so as to compensate for the TFT threshold voltage drift, thereby to improve the brightness non-uniformity of the display device and prolong the service life thereof. The pixel circuit comprises a first transistor, a second transistor, a third transistor, a fourth transistor, a fifth transistor, a first storage capacitor, a second storage capacitor, and a light-emitting element. The present invention is adapted to manufacture a display panel.

20 Claims, 5 Drawing Sheets

(56) References Cited

U.S. PATENT DOCUMENTS

| | | |
|---|---|---|
| 2006/0077134 A1* | 4/2006 | Hector et al. .................. 345/76 |
| 2006/0208979 A1* | 9/2006 | Fish et al. ....................... 345/81 |
| 2006/0232521 A1 | 10/2006 | Jang et al. |
| 2006/0290614 A1* | 12/2006 | Nathan et al. .................. 345/76 |
| 2007/0120785 A1* | 5/2007 | Kimura ........................... 345/82 |
| 2007/0236430 A1* | 10/2007 | Fish ................................. 345/82 |
| 2008/0211746 A1* | 9/2008 | Caligiore et al. ............... 345/76 |
| 2009/0021287 A1* | 1/2009 | Jang et al. ...................... 327/109 |
| 2009/0167743 A1* | 7/2009 | Goh et al. ....................... 345/211 |
| 2009/0174699 A1* | 7/2009 | Fish et al. ....................... 345/214 |
| 2010/0259531 A1* | 10/2010 | Ono ................................. 345/212 |
| 2011/0141160 A1* | 6/2011 | Nathan et al. .................. 345/690 |
| 2012/0120045 A1* | 5/2012 | Noguchi .......................... 345/211 |
| 2012/0293478 A1* | 11/2012 | Chaji et al. ..................... 345/212 |
| 2013/0187554 A1* | 7/2013 | Ono et al. ....................... 315/172 |
| 2014/0225883 A1* | 8/2014 | Chaji et al. ..................... 345/212 |
| 2014/0292623 A1* | 10/2014 | Moon et al. ..................... 345/82 |
| 2014/0312784 A1* | 10/2014 | Yin et al. ........................ 315/172 |

FOREIGN PATENT DOCUMENTS

| | | |
|---|---|---|
| CN | 203288217 U | 11/2013 |
| KR | 20080067856 A | 7/2008 |

* cited by examiner

PIXEL CIRCUIT, DRIVING METHOD THEREOF AND DISPLAY DEVICE

CROSS-REFERENCE TO RELATED APPLICATIONS

This application is a U.S. National Stage of International No. PCT/CN2013/081292, filed on Aug. 12, 2013. This application claims the benefit of Chinese Patent Application No. 201310231385.8, filed on Jun. 9, 2013. The disclosures of the above applications are incorporated herein by reference.

TECHNICAL FIELD

The present invention relates to the field of display technology, in particular to a pixel circuit, a driving method thereof, and a display device.

BACKGROUND

Semiconductor element technology, as a core of a display device, has made great progress along with the rapid development of display technology. For an existing display device, an Organic Light Emitting Diode (OLED), as a current-mode light-emitting element, is widely applied to the field of high performance display due to its features such as self-illumination, rapid response, a wide viewing angle as well as that it can be manufactured on a flexible substrate. There are two kinds of OLED depending on the driving modes, they are Passive Matrix Driving OLED (PMOLED) and Active Matrix Driving OLED (AMOLED). An AMOLED display, as a next-generation, new-type flat panel display, is expected to replace a Liquid Crystal Display (LCD) due to its advantages such as low production cost, high response speed, power economy, a wide operating temperature range and DC drive that makes it applicable for a portable device.

In an existing AMOLED display panel, each OLED includes a plurality of Thin Film Transistor (TFTs) switching circuits. Due to limitations in the production processes and production levels, usually the TFT switching circuits formed on a large-area glass substrate show non-uniformity in some electrical parameters such as a threshold voltage and mobility, such that the current flowing through the AMOLED not only varies along with the change of a stress of an on-state voltage caused by a long-time on-state of the TFT, but also varies along with the threshold voltage drift of the TFT. As a result, the brightness uniformity and brightness constancy of the display is affected. Furthermore, the AMOLED, during the operation, is in a bias state for a long period of time, so the degrading of the display device is accelerated, and as a result the service life of the display device is shortened.

SUMMARY

An embodiment of the present invention provides a pixel circuit, a driving method thereof, and a display device, so as to compensate for the TFT threshold voltage drift, thereby to improve the brightness non-uniformity of the display device and prolong the service life thereof.

In order to achieve the above object, an embodiment of the present invention adopts technical solutions as follows.

In one aspect, the present invention provides a pixel circuit, comprising a first transistor, a second transistor, a third transistor, a fourth transistor, a fifth transistor, a first storage capacitor, a second storage capacitor, and a light-emitting element, wherein a gate electrode of the first transistor is coupled to a first electrode of the third transistor, a first electrode of the first transistor is coupled to a second electrode of the fifth transistor, and a second electrode of the first transistor is coupled to a first voltage;

a gate electrode of the second transistor is coupled to a first control line, a first electrode of the second transistor is coupled to a second electrode of the fourth transistor, and a second electrode of the second transistor is coupled to the second electrode of the fifth transistor;

a gate electrode of the third transistor is coupled to the first control line, the first electrode of the third transistor is coupled to one end of the first storage capacitor, and a second electrode of the third transistor is coupled to a variable voltage;

a gate electrode of the fourth transistor is coupled to a second control line, and a first electrode of the fourth transistor is coupled to a data line;

a gate electrode of the fifth transistor is coupled to a light emission control line, and a first electrode of the fifth transistor is coupled to an anode of the light-emitting element;

one end of the second storage capacitor is coupled to the other end of the first storage capacitor, and the other end of the second storage capacitor is coupled to the variable voltage; and a cathode of the light-emitting element is coupled to a second voltage.

In another aspect, an embodiment of the present invention provides a display device comprising the above-mentioned pixel circuit.

In yet another aspect, an embodiment of the present invention provides a pixel circuit driving method, comprising:

turning on a second transistor, a third transistor, a fourth transistor and a fifth transistor, turning off a first transistor, inputting a low level into a data line, and eliminating charges on an anode of a light-emitting element;

turning off the fourth transistor and the fifth transistor, turning on the second transistor and the third transistor, controlling an on-state of the first transistor by a variable voltage, and storing a threshold voltage of the first transistor in a first storage capacitor;

turning on the fourth transistor, turning off the second transistor, the third transistor and the fifth transistor, and storing a high level inputted into the data line in a second storage capacitor; and turning off the second transistor, the third transistor and the fourth transistor, turning on the first transistor and the fifth transistor, and driving the light-emitting element to emit light with the current of the first transistor and the fifth transistor.

According to the pixel circuit, the driving method thereof and the display device of the present invention, switching and charging/discharging control is performed over the circuit by means of a plurality of transistors and capacitors, so that a gate-source voltage between the gate electrode and the source electrode of the first transistor may remain unchanged via the storage capacitor, and the current flowing through the first transistor may be independent of the threshold voltage and the first voltage of the first transistor. As a result, it is able to compensate for the inconsistency or drift of the threshold voltage of the first transistor, prevent the influence of an I-R drop of the first voltage on the current flowing through the light-emitting element, and remarkably improve the brightness uniformity of the display device. Furthermore, through eliminating the charges on the anode of the light-emitting element, it is able to prevent the light-emitting element from being in a positive bias state for a long period of time, thereby to effectively reduce the degrade rate of the light-emitting element and remarkably prolong the service life of the display device.

BRIEF DESCRIPTION OF THE DRAWINGS

In order to illustrate the embodiments of the present invention or the technical solutions of the prior art in a clearer manner, the drawings used for the descriptions of the embodiments or the prior art are briefly described hereinafter. Obviously, these drawings merely relate to some embodiments of the present invention, and it is able for a person skilled in the art, without any creative effort, to obtain other drawings based thereon.

DETAILED DESCRIPTION

The technical solutions of the present invention will be described hereinafter in a clear and complete manner in conjunction with the drawings. Obviously, the following embodiments are merely a part of, rather than all, the embodiments of the present invention. Based on these embodiments, it is able for a person skilled in the art, without any creative effort, to obtain the other embodiments, which also fall within the scope of the present invention.

Figure 1:
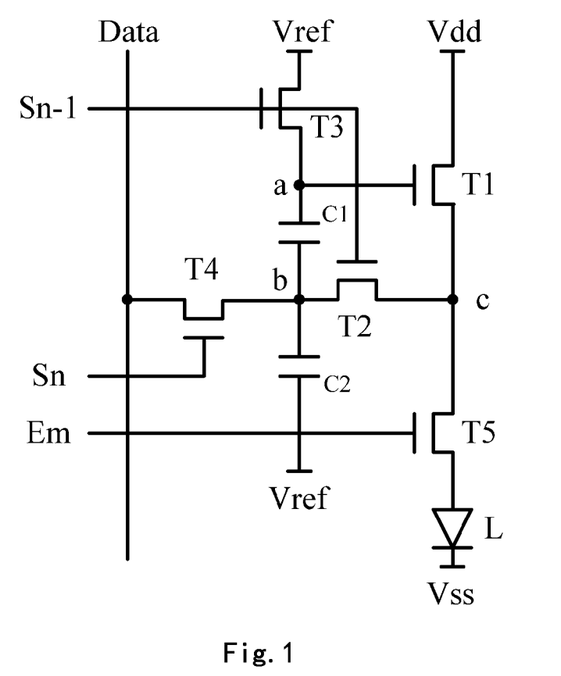
FIG. 1 is a schematic structure diagram showing the connection of a pixel circuit according to one embodiment of the present invention.

As shown in FIG. 1, a pixel circuit 1 comprises a first transistor T1, a second transistor T2, a third transistor T3, a fourth transistor T4, a fifth transistor T5, a first storage capacitor C1, a second storage capacitor C2 and a light-emitting element L.

A gate electrode of the first transistor T1 is coupled to a first electrode of the third transistor T3, a first electrode of the first transistor T1 is coupled to a second electrode of the fifth transistor T5, and a second electrode of the first transistor T1 is coupled to a first voltage ($V_{dd}$).

A gate electrode of the second transistor T2 is coupled to a first control line Sn−1, a first electrode of the second transistor T2 is coupled to a second electrode of the fourth transistor T4, and a second electrode of the second transistor T2 is coupled to the second electrode of the fifth transistor T5.

A gate electrode of the third transistor T3 is coupled to the first control line Sn−1, the first electrode of the third transistor T3 is coupled to one end of the first storage capacitor C1, and a second electrode of the third transistor T3 is coupled to a variable voltage ($V_{ref}$).

A gate electrode of the fourth transistor T4 is coupled to a second control line Sn, and a first electrode of the fourth transistor T4 is coupled to a data line Data.

A gate electrode of the fifth transistor T5 is coupled to a light emission controlling line Em, and a first electrode of the fifth transistor T5 is coupled to an anode of the light-emitting element L.

One end of the second storage capacitor C2 is coupled to the other end of the first storage capacitor C1, and the other end of the second storage capacitor C2 is coupled to the variable voltage ($V_{ref}$).

A cathode of the light-emitting element L is coupled to a second voltage ($V_{ss}$).

It is to be noted that, the light-emitting element L in this embodiment may be any current-driving light-emitting element in the prior art, such as an LED or an OLED. In this embodiment, OLED is taken as an example.

According to the pixel circuit, the driving method thereof and the display device of an embodiment of the present invention, switching and charging/discharging control is performed over a circuit by means of a plurality of transistors and capacitors, so that a gate-source voltage between the gate electrode and the source electrode of the first transistor may remain unchanged via the storage capacitor, and the current flowing through the first transistor may be independent of the threshold voltage and the first voltage of the first transistor. As a result, it is able to compensate for the inconsistency or drift of the threshold voltage of the first transistor, prevent the influence of an I-R drop of the first voltage on the current flowing through the light-emitting element, and remarkably improve the brightness uniformity of the display device. Furthermore, through eliminating the charges on the anode of the light-emitting element, it is able to prevent the light-emitting element from being in a positive bias state for a long period of time, thereby to effectively reduce the degrade rate of the light-emitting element and remarkably prolong the service life of the display device.

It is to be noted that, in this embodiment, the voltage $V_{dd}$ may be a high voltage, and the voltage $V_{ss}$ may be a low voltage or grounded.

The type of the first transistor T1 may be identical to or different from the type of the second transistor T2, the third transistor T3, the fourth transistor T4 and the fifth transistor T5. For example, the first transistor T1, the second transistor T2, the third transistor T3, the fourth transistor T4 and the fifth transistor T5 may all be N-type transistors; or the first transistor T1 may be an N-type transistor, while the second transistor T2, the third transistor T3, the fourth transistor T4 and the fifth transistor T5 may be P-type transistors; or the first transistor T1, the second transistor T2, the third transistor T3, the fourth transistor T4 and the fifth transistor T5 may all be P-type transistors; or the first transistor T1 may be a P-type transistor, while the second transistor T2, the third transistor T3, the fourth transistor T4 and the fifth transistor T5 may be N-type transistors. When different types of the transistors are adopted, external control signals for the pixel circuit may be different too.

When the N-type transistor is taken as an example, in the pixel circuit of an embodiment of the present invention, the first transistor T1, the second transistor T2, the third transistor T3, the fourth transistor T4 and the fifth transistor T5 may all be N-type enhanced TFTs or N-type depleted TFTs. The first electrodes of the first transistor T1, the second transistor T2, the third transistor T3, the fourth transistor T4 and the fifth transistor T5 may all refer to source electrodes, and the second electrodes thereof may all refer to drain electrodes.

The working procedure of the pixel circuit according to an embodiment of the present invention will be described hereinafter by taking the first transistor T1, the second transistor T2, the third transistor T3, the fourth transistor T4 and the fifth transistor T5 being all N-type depleted TFTs as an example.

Figure 2:
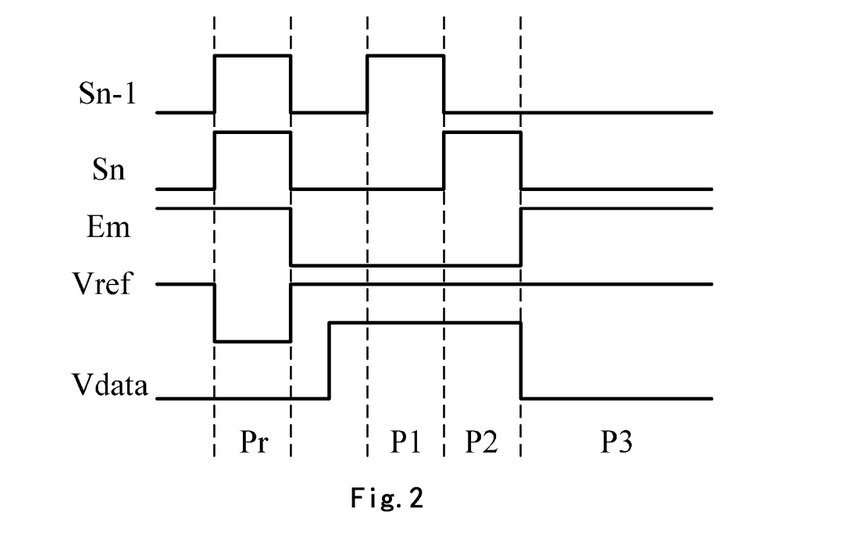
FIG. 2 is a time sequence diagram of signal lines when the pixel circuit as shown in FIG. 1 is driven.

When the pixel circuit as shown in FIG. 1 is working, its working procedure may be divided into four stages, i.e., an initialization stage, a collection stage, a data input stage and a light emission stage. FIG. 2 is a time sequence diagram of signal lines during the working procedure of the pixel circuit as shown in FIG. 1. As shown in FIG. 2, the initialization state, the collection stage, the data input stage and the light emission stage are represented by Pr, P1, P2 and P3, respectively.

Figure 3:
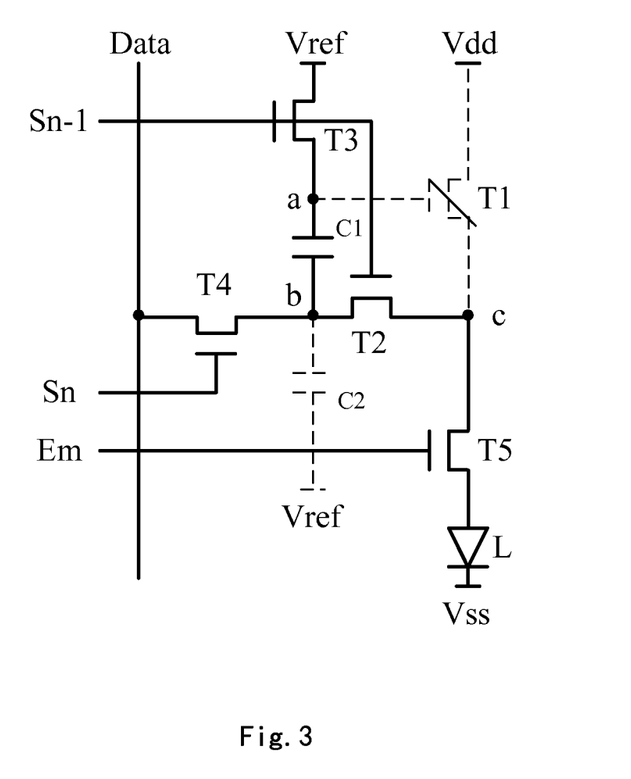
FIG. 3 is a schematic diagram showing an equivalent circuit of the pixel circuit as shown in FIG. 1 in an initialization stage.

The first stage is the initialization state. FIG. 3 shows an equivalent circuit for a first stage. The energized lines and elements are represented by solid lines, while the non-energized units are represented by broken lines, the representation way also applies to equivalent circuits mentioned hereinafter. In the initialization stage, the input of the first control line Sn−1, the second control line Sn and the light emission control line Em are a high level, while the variable voltage ($V_{ref}$) and a data voltage ($V_{data}$) outputted from the data line Data are a low level. As shown in FIG. 3, the second transistor T2, the third transistor T3, the fourth transistor T4 and the fifth transistor T5 are turned on, the first transistor T1 is turned off, and the first storage capacitor C1 and the second storage capacitor C2 are reset. A voltage in a node b where the first electrode of the second transistor T2 is coupled to the second electrode of the fourth transistor T4 is a low voltage ($V_{data}$), so the anode of the light-emitting element L is just the low potential ($V_{data}$). Charges stored in the light-emitting element L are outputted through the on-state fifth transistor T5, second transistor T2 and fourth transistor T4. As a result, it is able to eliminate the charges stored in the anode of the OLED for a long period of time, thereby to ensure that the OLED is not in the positive bias state, reduce the degrade rate of the OLED, and prolong the service life of the display device.

Figure 4:
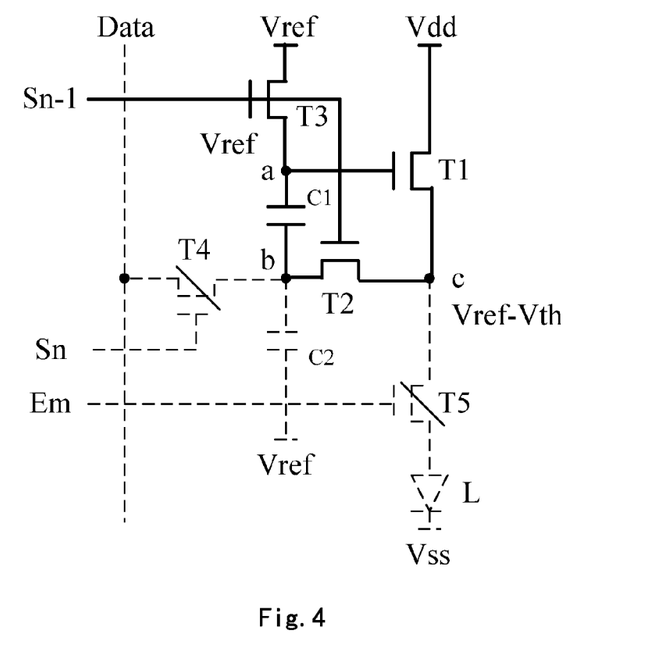
FIG. 4 is a schematic diagram showing an equivalent circuit of the pixel circuit as shown in FIG. 1 in a collection stage.

The second stage is the collection state. FIG. 4 shows an equivalent circuit for the second stage. In the collection stage, the variable voltage ($V_{ref}$) and the data voltage ($V_{data}$) outputted from the data line Data are a high level, a high level is inputted into the first control line Sn−1, and a low level is inputted into the second control line Sn and the light emission control line Em. As shown in FIG. 4, the fourth transistor T4 and the fifth transistor T5 are turned off, the second transistor T2 and the third transistor T3 are turned on, and the first transistor T1 is turned on by the high level of the variable voltage ($V_{ref}$). A voltage at a node a where the gate electrode of the first transistor T1 is coupled to the first electrode of the third transistor T3 is a high voltage ($V_{ref}$). Since this voltage just makes the first transistor T1 turned on, the potential at point c, which is identical to the potential at the other end of the first storage capacitor, is increased to $V_{ref}-V_{th}$. $V_{th}$ is a threshold voltage of the first transistor, and it is stored in the first storage capacitor C1.

Figure 5:
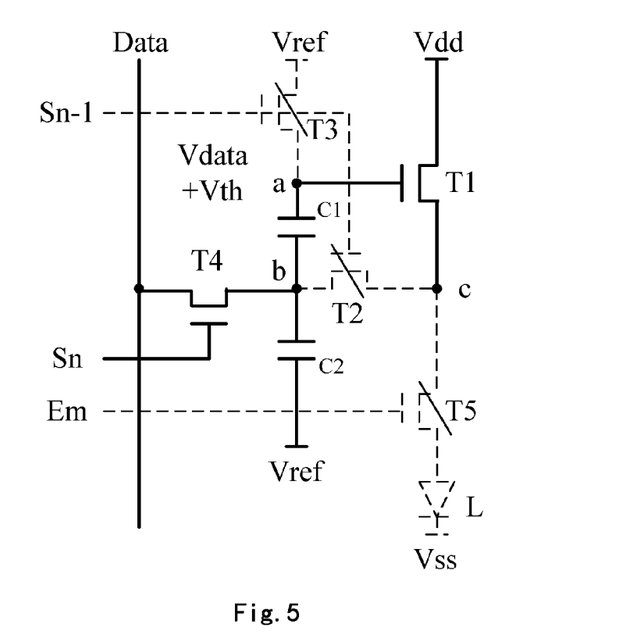
FIG. 5 is a schematic diagram showing an equivalent circuit of the pixel circuit as shown in FIG. 1 in a data-input stage.

The third stage is the data input state. FIG. 5 shows an equivalent circuit for the third stage. In the data input stage, the variable voltage ($V_{ref}$) and the data voltage ($V_{data}$) outputted from the data line Data are a high level, a high level is input into the second control line Sn, and a low level is input into the first control line Sn−1 and the light emission control line Em. As shown in FIG. 5, the second transistor T2, the third transistor T3 and the fifth transistor T5 are turned off, the fourth transistor T4 is turned on, and the data voltage ($V_{data}$) outputted from the data line Data is stored in the second storage capacitor C2. At this time, the voltage at the node b is just the data voltage ($V_{data}$). The threshold voltage $V_{th}$ of the first transistor is stored in the first storage capacitor C1 in the second stage, so the potential at the node a is increased to $A=V_{ref}+V_{data}-V_{ref}+V_{th}=V_{data}+V_{th}$.

Figure 6:
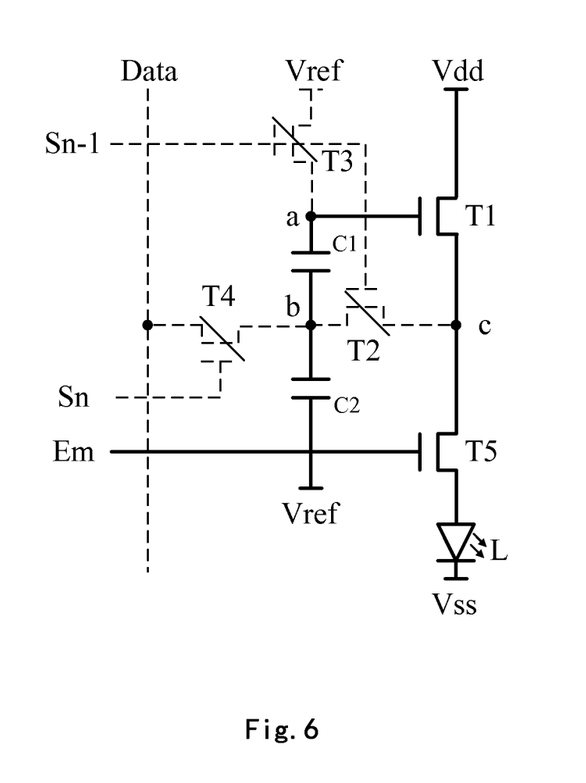
FIG. 6 is a schematic diagram showing an equivalent circuit of the pixel circuit as shown in FIG. 1 in a light emission stage.

The fourth stage is the light emission state. FIG. 6 shows an equivalent circuit for the fourth stage. In the light emission stage, the variable voltage ($V_{ref}$) and the input of the light emission control line Em are a high level, and the inputs of the first control line Sn−1 and the second control line Sn, and the data voltage ($V_{data}$) outputted from the data line Data are a low level. As shown in FIG. 6, the second transistor T2, the third transistor T3 and the fourth transistor T4 are turned off, and the first transistor T1 and the fifth transistor T5 are turned on. At this time, the voltage that makes the first transistor turned on is just the voltage at the node a in the third stage, i.e., $V_{gs}=V_{data}+V_{th}$, so the current flowing through the first transistor T1 drives the OLED to emit light. The current $I_{OLED}$ may be calculated by the following equation:

$$I_{OLED} = \frac{1}{2} \times K \times (V_{gs} - V_{th})^2 \qquad (1)$$
$$= \frac{1}{2} \times K \times (V_{data} + V_{th} - V_{th})^2$$
$$= \frac{1}{2} \times K \times (V_{data})^2,$$

wherein K is a current constant associated with the first transistor T1, $V_{data}$ is a data voltage, $V_{ref}$ is a variable voltage, and $V_{th}$ is a threshold voltage of the transistor. In the prior art, the threshold voltages $V_{th}$ for different pixel units are different from each other, and the threshold voltage $V_{th}$ for an identical pixel may drift with time. This will result in difference in the brightness. This difference is associated with a previously displayed image, so usually a ghost image occurs.

According to the equation (1), the current $I_{OLED}$ for driving the OLED to emit light is independent of the threshold voltage $V_{th}$ of the first transistor T1, and the current $I_{OLED}$ is not under control of the first voltage ($V_{dd}$) either. So, it is able to eliminate the influence of the inconsistency of the threshold voltages of the transistors and an I-R drop of the first voltage on the display effect. Switching and charging/discharging control is performed over the circuit by means of a plurality of transistors and capacitors, so that a gate-source voltage between the gate electrode and the source electrode of the first transistor may remain unchanged via the storage capacitor, and the current flowing through the first transistor may be independent of the threshold voltage and the first voltage of the first transistor. As a result, it is able to compensate for the inconsistency or drift of the threshold voltage of the first transistor, prevent the influence of the I-R drop of the first voltage on the current flowing through the light-emitting element, and remarkably improve the brightness uniformity of the display device. Furthermore, through eliminating the charges on the anode of the light-emitting element, it is able to prevent the light-emitting element from being in a positive bias state for a long period of time, thereby to effectively reduce the degrade rate of the light-emitting element and remarkably prolong the service life of the display device.

It is to be noted that, in the above-mentioned embodiment, the transistors are all N-type depleted TFTs. Alternatively, N-type enhanced TFTs may also be used. The difference is that, for the depleted TFTs, the threshold voltage $V_{th}$ is negative, while for the enhanced TFTs, the threshold voltage $V_{th}$ is positive.

In addition, the first transistor T1 may also be an N-type transistor, and the second transistor T2, the third transistor T3, the fourth transistor T4 and the fifth transistor T5 may be P-type transistors. The time sequence of the external signals for driving the pixel circuit with such a structure shall be adjusted correspondingly. The time sequences of the first control line Sn−1, the second control line Sn and the light emission control line Em are contrary to the time sequences of the corresponding signals as shown in FIG. 2 (i.e., with a phase difference of 180°).

Alternatively, the first transistor T1, the second transistor T2, the third transistor T3, the fourth transistor T4 and the fifth transistor T5 may be P-type transistors. The time sequences of the external signals for driving the pixel circuit with such a structure shall also be adjusted correspondingly. The time sequences of the first control line Sn−1, the second control line Sn, the variable voltage ($V_{ref}$), the data voltage ($V_{data}$) and the light emission control line Em are contrary to the time sequences of the corresponding signals as shown in FIG. 2 (i.e., with a phase difference of 180°).

Alternatively, the first transistor T1 may be a P-type transistor, and the second transistor T2, the third transistor T3, the fourth transistor T4 and the fifth transistor T5 may be N-type transistors. The time sequences of the external signals for driving the pixel circuit with such a structure shall also be adjusted correspondingly. The time sequences of the variable voltage $V_{ref}$ and the data voltage ($V_{data}$) are contrary to the time sequences of the corresponding signals as shown in FIG. 2 (i.e., with a phase difference of 180°).

The present invention further provides a display device comprising any one of the above-mentioned pixel circuits. The display device may comprise a plurality of pixel unit arrays. Each pixel unit comprises any one of the above-mentioned pixel circuits and has the same beneficial effects as the pixel circuits mentioned hereinbefore. The descriptions of the pixel circuits will not be repeated herein.

To be specific, the display device according to an embodiment the present invention may be a display device having a current-driving light-emitting element, such as an LED display or an OLED display.

According to the display device comprising the mentioned pixel circuit, switching and charging/discharging control is performed over the circuit by means of a plurality of transistors and capacitors, so that a gate-source voltage between the gate electrode and the source electrode of the first transistor may remain unchanged via the storage capacitor, and the current flowing through the first transistor may be independent of the threshold voltage and the first voltage of the first transistor. As a result, it is able to compensate for the inconsistency or drift of the threshold voltage of the first transistor, prevent the influence of the I-R drop of the first voltage on the current flowing through the light-emitting element, and remarkably improve the brightness uniformity of the display device. Furthermore, through eliminating the charges on the anode of the light-emitting element, it is able to prevent the light-emitting element from being in a positive bias state for a long period of time, thereby to effectively reduce the degrade rate of the light-emitting element and remarkably prolong the service life of the display device.

Figure 7:
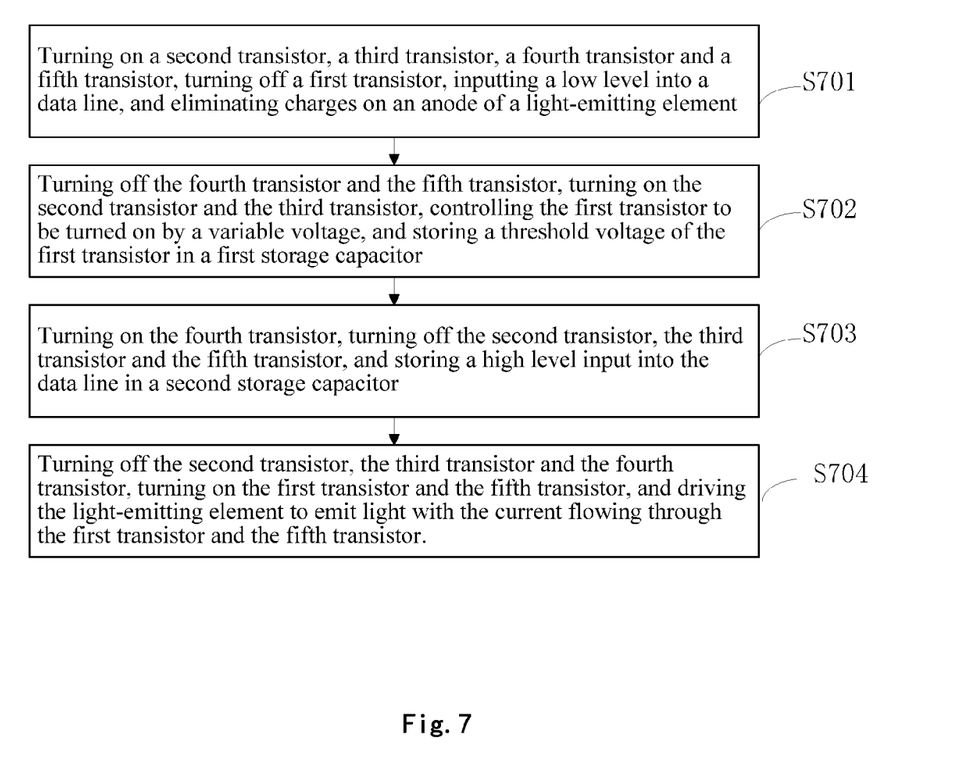
FIG. 7 is a flow chart of a pixel circuit driving method according to one embodiment of the present invention.

An embodiment of the present invention further provides a pixel circuit driving method for use in the aforementioned pixel circuit. As shown in FIG. 7, the method comprises:

Step S701: turning on a second transistor, a third transistor, a fourth transistor and a fifth transistor, turning off a first transistor, inputting a low level into a data line, and eliminating charges on an anode of a light-emitting element;

Step S702: turning off the fourth transistor and the fifth transistor, turning on the second transistor and the third transistor, controlling the first transistor to be turned on by a variable voltage, and storing a threshold voltage of the first transistor in a first storage capacitor;

Step S703: turning on the fourth transistor, turning off the second transistor, the third transistor and the fifth transistor, and storing a high level inputted into the data line in a second storage capacitor; and Step S704: turning off the second transistor, the third transistor and the fourth transistor, turning on the first transistor and the fifth transistor, and driving the light-emitting element to emit light with the current flowing through the first transistor and the fifth transistor.

According to the pixel circuit driving method of an embodiment of the present invention, switching and charging/discharging control is performed over the circuit by means of a plurality of transistors and capacitors, so that a gate-source voltage between the gate electrode and the source electrode of the first transistor may remain unchanged via the storage capacitor, and the current flowing through the first transistor may be independent of the threshold voltage and the first voltage of the first transistor. As a result, it is able to compensate for the inconsistency or drift of the threshold voltage of the first transistor, prevent the influence of the I-R drop of the first voltage on the current flowing through the light-emitting element, and remarkably improve the brightness uniformity of the display device. Furthermore, through eliminating the charges on the anode of the light-emitting element, it is able to prevent the light-emitting element from being in a positive bias state for a long period of time, thereby to effectively reduce the degrade rate of the light-emitting element and remarkably prolong the service life of the display device.

It is to be noted that, the light-emitting element in this embodiment may be any current-driving light-emitting element in the prior art, such as an LED or an OLED.

The type of the first transistor T1 may be identical to or different from that of the second transistor T2, the third transistor T3, the fourth transistor T4 and the fifth transistor T5. For example, the first transistor T1, the second transistor T2, the third transistor T3, the fourth transistor T4 and the fifth transistor T5 may all be N-type transistors; or the first transistor T1 may be an N-type transistor, while the second transistor T2, the third transistor T3, the fourth transistor T4 and the fifth transistor T5 may be P-type transistors; or the first transistor T1, the second transistor T2, the third transistor T3, the fourth transistor T4 and the fifth transistor T5 may all be P-type transistors; or the first transistor T1 may be a P-type transistor, while the second transistor T2, the third transistor T3, the fourth transistor T4 and the fifth transistor T5 may all be N-type transistors.

When the N-type transistor is taken as an example, in the pixel circuit according to an embodiment of the present invention, the first transistor T1, the second transistor T2, the third transistor T3, the fourth transistor T4 and the fifth transistor T5 may all be N-type enhanced TFTs or N-type depleted TFTs.

It is to be noted that, when the first transistor, the second transistor, the third transistor, the fourth transistor and the fifth transistor are N-type depleted transistors, the time sequences of the control signals, as shown in FIG. 2, comprises:

an initialization stage in which a high level is inputted into a first control line, a second control line and a light emission control line, and a low level is inputted into the variable voltage and the data line;

a collection stage in which a low level is inputted into the second control line and the light emission control line, and a high level is inputted into the first control line, the variable voltage and the data line;

a data input stage in which a low level is inputted into the first control line and the light emission control line, and a high level is inputted into the second control line, the variable voltage and the data line; and a light emission stage in which a low level is inputted into the first control line, the second control line and the data line, and a high level is inputted into the variable voltage and the light emission control line.

For example, when the first transistor, the second transistor, the third transistor, the fourth transistor and the fifth transistor are all N-type depleted TFTs, Step S701 specifically comprises:

The step is performed in the initialization stage, as shown in FIG. 2, in the initialization stage, a high level is inputted into the first control line Sn−1, the second control line Sn and the light emission control line Em, and the variable voltage ($V_{ref}$) and the data voltage ($V_{data}$) outputted from the data line Data are a low level. As shown in FIG. 3, the second transistor T2, the third transistor T3, the fourth transistor T4 and the fifth transistor T5 are turned on, the first transistor T1 is turned off, and the first storage capacitor C1 and the second storage capacitor C2 are reset. A voltage in a node b where a first electrode of the second transistor T2 is coupled to a second electrode of the fourth transistor T4 is a low voltage ($V_{data}$), so a potential at the anode of the light-emitting element L is just the low voltage ($V_{data}$). Charges stored in the light-emitting element L is outputted through the on-state fifth transistor T5, second transistor T2 and fourth transistor T4. As a result, it is able to eliminate the charges stored at the anode of the OLED for a long period of time, thereby to ensure that the OLED is not in the positive bias state, reduce the degrade rate of the OLED, and prolong the service life of the display device.

Correspondingly, Step S702 specifically comprises:

The step is performed in the collection stage, in which the variable voltage ($V_{ref}$) and the data voltage ($V_{data}$) outputted from the data line Data are a high level, a high level is inputted into the first control line Sn−1, and a low level is inputted into the second control line Sn and the light emission control line Em. As shown in FIG. 4, the fourth transistor T4 is turned off, the fifth transistor T5, the second transistor T2 and the third transistor T3 are turned on, and the first transistor T1 is turned on by the high level inputted by the variable voltage ($V_{ref}$). A voltage at a node a where the gate electrode of the first transistor T1 is coupled to the first electrode of the third transistor T3 is a high voltage ($V_{ref}$). This voltage just makes the first transistor T1 turned on, so that the potential at point c, which is identical to the potential at the other end of the first storage capacitor, is increased to $V_{ref}-V_{th}$. $V_{th}$ is the threshold voltage of the first transistor, and it is stored in the first storage capacitor C1.

Step S703 specifically comprises:

The step is performed in the data input stage, in which the variable voltage ($V_{ref}$) and the data voltage ($V_{data}$) outputted from the data line Data are a high level, a high level is inputted into the second control line Sn, and a low level is inputted into the first control line Sn−1 and the light emission control line Em. As shown in FIG. 5, the second transistor T2, the third transistor T3 and the fifth transistor T5 are turned off, the fourth transistor T4 is turned on, and the data voltage ($V_{data}$) outputted from the data line Data is stored in the second storage capacitor C2. At this time, the voltage at the point b is just the data voltage ($V_{data}$). The threshold voltage $V_{th}$ of the first transistor is stored in the first storage capacitor C1 in the collection stage, so the potential at the node a is increased to $A=V_{ref}+V_{data}-V_{ref}+V_{th}=V_{data}+V_{th}$.

Step S704 specifically comprises:

The step is performed in light emission stage, in which the variable voltage ($V_{ref}$) and the input of the light emission control line Em are a high level, and the inputs of the first control line Sn−1, the second control line Sn and the data voltage ($V_{data}$) outputted from the data line Data are a low level. As shown in FIG. 6, the second transistor T2, the third transistor T3 and the fourth transistor T4 are turned off, and the first transistor T1 and the fifth transistor T5 are turned on. At this time, the voltage that causes the first transistor to be turned on is just the voltage at the node a in the data input stage, i.e., $V_{gs}=V_{data}+V_{th}$, so the current flowing through the first transistor T1 drives the OLED to emit light. The current $T_{OLED}$ for driving the OLED to emit light is independent of the threshold voltage $V_{th}$ of the first transistor T1, and it is not under control of the first voltage ($V_{dd}$) either. So, it is able to eliminate the influence of the inconsistency of the threshold voltages of the transistors and the I-R drop of the first voltage on the display effect.

It may be appreciated that, all or a part of the steps of the method may be performed by hardware associated with program instructions. The program instructions may be stored in a computer-readable storage medium, and the steps of the method are executed during the execution of the program instructions. The storage medium may be any medium capable of storing a program code, such as a ROM, a RAM, a disk or an optical disk.

The above are merely the preferred embodiments of the present invention but the present invention are not limited thereto. It should be noted that, a person skilled in the art may further make improvements and modifications without departing from the principle of the present invention, and these improvements and modifications shall also be considered as the scope of the present invention. Therefore, the scope of the present invention shall be defined by the appended claims.

What is claimed is:

1. A pixel circuit, comprising:
a first transistor, a second transistor, a third transistor, a fourth transistor, a fifth transistor, a first storage capacitor, a second storage capacitor, and a light-emitting element, wherein a gate electrode of the first transistor is coupled to a first electrode of the third transistor, a first electrode of the first transistor is coupled to a second electrode of the fifth transistor, and a second electrode of the first transistor is coupled to a first voltage;

a gate electrode of the second transistor is coupled to a first control line, a first electrode of the second transistor is coupled to a second electrode of the fourth transistor, and a second electrode of the second transistor is coupled to the second electrode of the fifth transistor;

a gate electrode of the third transistor is coupled to the first control line, the first electrode of the third transistor is coupled to one end of the first storage capacitor, and a second electrode of the third transistor is coupled to a variable voltage;

a gate electrode of the fourth transistor is coupled to a second control line, and a first electrode of the fourth transistor is coupled to a data line;

a gate electrode of the fifth transistor is coupled to a light emission control line, and a first electrode of the fifth transistor is coupled to an anode of the light-emitting element;

one end of the second storage capacitor is coupled to the other end of the first storage capacitor, and the other end of the second storage capacitor is coupled to the variable voltage; and a cathode of the light-emitting element is coupled to a second voltage.

2. The pixel circuit according to claim 1, wherein a type of the first transistor is identical to or different from that of the second transistor, the third transistor, the fourth transistor and the fifth transistor.

3. The pixel circuit according to claim 2, wherein the first transistor, the second transistor, the third transistor, the fourth transistor and the fifth transistor are all N-type transistors or P-type transistors.

4. The pixel circuit according to claim 2, wherein
the first transistor is an N-type transistor, while the second transistor, the third transistor, the fourth transistor and the fifth transistor are P-type transistors; or
the first transistor is a P-type transistor, while the second transistor, the third transistor, the fourth transistor and the fifth transistor are N-type transistors.

5. The pixel circuit according to claim 1, wherein the first electrodes of the first transistor, the second transistor, the third transistor, the fourth transistor and the fifth transistor are all source electrodes, and the second electrodes thereof are all drain electrodes.

6. The pixel circuit according to claim 5, wherein the transistors are depleted thin film transistors or enhanced thin film transistors.

7. The pixel circuit according to claim 5, wherein the light-emitting element is an organic light emitting diode.

8. The pixel circuit according to claim 1, wherein the transistors are depleted thin film transistors or enhanced thin film transistors.

9. The pixel circuit according to claim 1, wherein the light-emitting element is an organic light emitting diode.

10. A display device comprising the pixel circuit according to claim 1.

11. A pixel circuit driving method, comprising:
turning on a second transistor, a third transistor, a fourth transistor and a fifth transistor, turning off a first transistor, inputting a low level into a data line, and eliminating charges on an anode of a light-emitting element;
turning off the fourth transistor and the fifth transistor, turning on the second transistor and the third transistor, controlling the first transistor to be turned on by a variable voltage, and storing a threshold voltage of the first transistor in a first storage capacitor;
turning on the fourth transistor, turning off the second transistor, the third transistor and the fifth transistor, and storing a high level inputted into the data line in a second storage capacitor; and
turning off the second transistor, the third transistor and the fourth transistor, turning on the first transistor and the fifth transistor, and driving the light-emitting element to emit light with the current flowing through the first transistor and the fifth transistor.

12. The pixel circuit driving method according to claim 11, wherein a type of the first transistor is identical to or different from a type of the second transistor, the third transistor, the fourth transistor and the fifth transistor.

13. The pixel circuit driving method according to claim 12, wherein the first transistor, the second transistor, the third transistor, the fourth transistor and the fifth transistor are all N-type transistors or P-type transistors.

14. The pixel circuit driving method according to claim 12, wherein
the first transistor is an N-type transistor, while the second transistor, the third transistor, the fourth transistor and the fifth transistor are P-type transistors; or
the first transistor is a P-type transistor, while the second transistor, the third transistor, the fourth transistor and the fifth transistor are N-type transistors.

15. The pixel circuit driving method according to claim 12, wherein the first electrodes of the first transistor, the second transistor, the third transistor, the fourth transistor and the fifth transistor are all source electrodes, and the second electrodes thereof are all drain electrodes.

16. The pixel circuit driving method according to claim 12, wherein the transistors are depleted thin film transistors or enhanced thin film transistors.

17. The pixel circuit driving method according to claim 16, wherein when the first transistor, the second transistor, the third transistor, the fourth transistor and the fifth transistor are N-type depleted thin film transistors, time sequences of control signals comprises:
an initialization stage in which a high level is inputted into a first control line, a second control line and a light emission control line, and a low level is inputted into the variable voltage and the data line;
a collection stage in which a low level is inputted into the second control line and the light emission control line, and a high level is inputted into the first control line, the variable voltage and the data line;
a data input stage in which a low level is inputted into the first control line and the light emission control line, and a high level is inputted into the second control line, the variable voltage and the data line; and
a light emission stage in which a low level is inputted into the first control line, the second control line and the data line, and a high level is inputted into the variable voltage and the light emission control line.

18. The pixel circuit driving method according to claim 11, wherein the first electrodes of the first transistor, the second transistor, the third transistor, the fourth transistor and the fifth transistor are all source electrodes, and the second electrodes thereof are all drain electrodes.

19. The pixel circuit driving method according to claim 11, wherein the transistors are depleted thin film transistors or enhanced thin film transistors.

20. The pixel circuit driving method according to claim 19, wherein when the first transistor, the second transistor, the third transistor, the fourth transistor and the fifth transistor are N-type depleted thin film transistors, time sequences of control signals comprises:
an initialization stage in which a high level is inputted into a first control line, a second control line and a light emission control line, and a low level is inputted into the variable voltage and the data line;
a collection stage in which a low level is inputted into the second control line and the light emission control line, and a high level is inputted into the first control line, the variable voltage and the data line;
a data input stage in which a low level is inputted into the first control line and the light emission control line, and a high level is inputted into the second control line, the variable voltage and the data line; and
a light emission stage in which a low level is inputted into the first control line, the second control line and the data line, and a high level is inputted into the variable voltage and the light emission control line.

* * * * *

UNITED STATES PATENT AND TRADEMARK OFFICE
CERTIFICATE OF CORRECTION

PATENT NO. : 9,099,417 B2  
APPLICATION NO. : 14/236283  
DATED : August 4, 2015  
INVENTOR(S) : Jingwen Yin et al.

Page 1 of 1

It is certified that error appears in the above-identified patent and that said Letters Patent is hereby corrected as shown below:

Title Page – Foreign Application Priority Data – item (30), please insert:

--CN2013102313858 filed June 9, 2013--

Signed and Sealed this  
Twenty-ninth Day of December, 2015

Michelle K. Lee  
*Director of the United States Patent and Trademark Office*